(12) United States Patent
Washio et al.

(10) Patent No.: US 8,440,268 B2
(45) Date of Patent: May 14, 2013

(54) METHOD AND APPARATUS FOR GROWING PLASMA ATOMIC LAYER

(75) Inventors: Keisuki Washio, Okayama (JP);
Kazutoshi Murata, Okayama (JP);
Naomasa Miyatake, Okayama (JP);
Hiroyuki Tachibana, Okayama (JP);
Nozomu Hattori, Okayama (JP)

(73) Assignee: Mitsui Engineering & Shipbuilding Co., Ltd., Tokyo (JP)

( * ) Notice: Subject to any disclaimer, the term of this patent is extended or adjusted under 35 U.S.C. 154(b) by 1240 days.

(21) Appl. No.: 12/294,428

(22) PCT Filed: Mar. 28, 2007

(86) PCT No.: PCT/JP2007/056621
§ 371 (c)(1),
(2), (4) Date: Sep. 24, 2008

(87) PCT Pub. No.: WO2007/114155
PCT Pub. Date: Oct. 11, 2007

(65) Prior Publication Data
US 2009/0291232 A1 Nov. 26, 2009

(30) Foreign Application Priority Data
Mar. 30, 2006 (JP) ................................. 2006-094755

(51) Int. Cl.
*H05H 1/24* (2006.01)
(52) U.S. Cl.
USPC ............................ 427/569; 427/579; 118/715
(58) Field of Classification Search ... 118/715; 427/569, 427/579
See application file for complete search history.

(56) References Cited

U.S. PATENT DOCUMENTS

| | | | |
|---|---|---|---|
| 2005/0181555 A1* | 8/2005 | Haukka et al. | 438/232 |
| 2006/0049138 A1* | 3/2006 | Miyake et al. | 216/58 |
| 2007/0116887 A1* | 5/2007 | Faguet | 427/569 |

FOREIGN PATENT DOCUMENTS

| | | |
|---|---|---|
| JP | 01-179423 A | 7/1989 |
| JP | 05-160152 A | 6/1993 |
| JP | 2002-371359 A | 12/2002 |
| JP | 2003-86581 | 3/2003 |
| JP | 2003-086581 A | 3/2003 |
| JP | 2003-209110 A | 7/2003 |
| KR | 2002-0095342 A | 12/2002 |
| WO | WO 2004/073363 | * 8/2004 |

OTHER PUBLICATIONS

Jinwoo Kim et al., Composition, structure and electrical characteristics of HfO2 gate dielectrics grown using the remote- and direct-plasma atomic layer deposition methods, Journal of Applied Physics, Nov. 14, 2005, vol. 98, No. 9, American Institute of Physics, New York, U.S.

(Continued)

*Primary Examiner* — Elizabeth Burkhart
(74) *Attorney, Agent, or Firm* — Blakely, Sokoloff, Taylor & Zafman (57) ABSTRACT

Oxygen gas, for example, is introduced into a film forming chamber, and high-frequency power is supplied to a plurality of monopole antennas arranged above a silicon substrate (101) in the film forming chamber to generate a plasma of the introduced oxygen gas, thereby supplying atomic oxygen (123) onto the surface of an aminosilane molecular layer (102). This plasma generation is performed for about 1 sec. With this operation, the adsorption layer (102) adsorbed onto the surface of the silicon substrate (101) is oxidized, thereby forming a silicon oxide layer (112) corresponding to one atomic layer of silicon on the surface of the silicon substrate (101).

4 Claims, 5 Drawing Sheets

OTHER PUBLICATIONS

K Murata et al., Development of ALD/PECVD reactor for gate insulator of LTPS-TFT-evaluation of film quality, Database INSPEC [Online], The Institution of Electrical Engineers, 2005, Stevenage, GB.

Hiroyasu Sato et al., Design of folded monopole array antenna used for large area plasma production, Antennas and Propagation Society Symposium, 2004, IEEE Monterey, CA, USA, Jun. 20-25, 2004, Piscataway, NJ, USA, IEEE, vol. 1, pp. 1026-1029.

* cited by examiner

METHOD AND APPARATUS FOR GROWING PLASMA ATOMIC LAYER

The present patent application is a Utility claiming the benefit of Application No. PCT/JP2007/056621, filed Mar. 28/2007.

TECHNICAL FIELD

The present invention relates to a method and apparatus for growing a plasma atomic layer, which use a plasma for atomic layer growth for forming a thin film by depositing atomic and molecular layers one after another.

BACKGROUND ART

Atomic layer deposition has been developed as a technique which can uniformly form a very thin film with an excellent step coverage (see patent reference 1: Japanese Patent Laid-Open No. 1-179423 and patent reference 2: Japanese Patent Laid-Open No. 5-160152). The atomic layer deposition is a technique of forming a thin film by depositing atomic layers one after another by alternately supplying materials of respective elements constituting a film to be formed. In the atomic layer deposition, one or n layers alone are adsorbed onto the substrate surface while supplying the materials of the respective elements so that no surplus materials contribute to the deposition. This is called the self-limiting deposition.

The atomic layer deposition has both a shape adaptability and film thickness controllability as high as those of the general CVD (Chemical Vapor Deposition), and is therefore expected to be practically applied to the formation of a capacitor and an insulating film called the "high-k gate" of a memory device. Still better, the atomic layer deposition can form an insulating film at temperatures as low as about 300° C., and is therefore expected to be applied to the formation of, especially, the gate insulating film of a thin-film transistor of a display device using a glass substrate.

DISCLOSURE OF INVENTION

Problem to be Solved by the Invention

When, for example, a metal oxide film (metal nitride film) is formed by the atomic layer deposition, two types of gasses, i.e., a metal source gas and an oxidizing gas (nitriding gas) are alternately used, so gas injection and exhaust are repeated. For this reason, the thickness of a film formed per unit time is small, that is, the film forming rate is low in the atomic layer deposition, compared to the general CVD which deposits a film by continuously injecting a gas.

To overcome this problem, there is a method which uses atomic oxygen (nitrogen) imparted with high reactivity by a plasma. This method can improve the oxidation (nitridation) rate, thus improving the film forming rate. However, when a plasma is generated in a film forming chamber in which a film forming process is performed, for example, the interface between the semiconductor and the insulating film is generally damaged due to the adverse influence of charged particles in the plasma. On the other hand, there is a technique which uses a remote plasma that inflicts no damage to that interface. This technique produces atomic oxygen (nitrogen) by a remote plasma, and supplies the produced atomic oxygen (nitrogen) onto a substrate to be processed. However, the atomic oxygen (nitrogen) has an extremely short lifetime, so it has often turned into molecular oxygen (nitrogen) already at the time point when it is supplied onto the substrate, resulting in a poor efficiency.

The present invention has been made to solve the above-described problems, and has as its object to improve the rate of film formation by atomic layer growth using a plasma, while the occurrence of any damage is suppressed.

Means of Solution to the Problem

A method for growing a plasma atomic layer according to the present invention comprises at least a first step of supplying a source gas containing an organic compound onto a surface of a substrate heated, thereby forming an adsorption layer in which the organic compound is adsorbed onto the surface of the substrate in a film forming chamber which accommodates a monopole antenna, a second step of removing the source gas from inside the film forming chamber after the supply of the source gas is stopped, and a third step of injecting a reactant gas containing a reactant substance into the film forming chamber, and supplying a high-frequency wave to the monopole antenna to generate a plasma of the reactant gas, thereby producing an atomic substance, and combining the atomic substance with the adsorption layer, thereby forming a compound layer, in which the adsorption layer is combined with the reactant substance, on the substrate. The reactant substance is one member selected from the group consisting of oxygen and nitrogen.

As an example, the method comprises at least a first step of supplying a source gas containing an organic compound onto a surface of a substrate heated, thereby forming an adsorption layer in which the organic compound is adsorbed onto the surface of the substrate in a film forming chamber which accommodates a monopole antenna, a second step of removing the source gas from inside the film forming chamber after the supply of the source gas is stopped, and a third step of injecting an oxidizing gas containing oxygen into the film forming chamber, and supplying a high-frequency wave to the monopole antenna to generate a plasma of the oxidizing gas, thereby producing atomic oxygen, and oxidizing the adsorption layer by the atomic oxygen, thereby forming an oxide layer on the substrate. In this case, atomic oxygen having higher reactivity than ozone performs the oxidation.

As another example, the method comprises at least a first step of supplying a source gas containing an organic compound onto a surface of a substrate heated, thereby forming an adsorption layer in which the organic compound is adsorbed onto the surface of the substrate in a film forming chamber, a second step of removing the source gas from inside the film forming chamber after the supply of the source gas is stopped, and a third step of injecting a nitriding gas containing nitrogen into the film forming chamber, and supplying a high-frequency wave to the monopole antenna to generate a plasma of the nitriding gas, thereby producing atomic nitrogen, and nitriding the adsorption layer by the atomic nitrogen, thereby forming a nitride layer on the substrate. In this case, atomic nitrogen having high reactivity performs the nitridation.

In the above-described method for growing a plasma atomic layer, the distance between the monopole antenna and the substrate in the third step may be longer than that in the first step.

An apparatus for growing a plasma atomic layer according to the present invention comprises at least a film forming chamber which can be sealed, a substrate table which is accommodated in the film forming chamber and mounts a substrate to be processed, heating means, mounted on the substrate table, for heating the substrate, source gas supply means for injecting a source gas containing an organic compound into the film forming chamber, reactant gas supply means for injecting a reactant gas containing a reactant substance into the film forming chamber, plasma generating means including a monopole antenna which generates a plasma of the reactant gas introduced by the reactant gas supply means, and exhaust means for evacuating the inside of the film forming chamber, wherein the source gas is introduced by the source gas supply means, thereby forming an adsorption layer containing the organic compound on the substrate to be processed, which is heated by the heating means, and then the reactant substance is combined with the adsorption layer by an atomic substance produced by the plasma of the reactant gas, which is generated by the plasma generating means. The reactant substance is one member selected from the group consisting of oxygen and nitrogen.

As an example, the apparatus comprises at least a film forming chamber which can be sealed, a substrate table which is accommodated in the film forming chamber and mounts a substrate to be processed, heating means, mounted on the substrate table, for heating the substrate, source gas supply means for injecting a source gas containing an organic compound into the film forming chamber, oxidizing gas supply means for injecting an oxidizing gas containing oxygen into the film forming chamber, plasma generating means including a monopole antenna which generates a plasma of the oxidizing gas introduced by the oxidizing gas supply means, and exhaust means for evacuating the inside of the film forming chamber, wherein the source gas is introduced by the source gas supply means, thereby forming an adsorption layer containing the organic compound on the substrate to be processed, which is heated by the heating means, and then the adsorption layer is oxidized by atomic oxygen produced by the plasma of the oxidizing gas, which is generated by the plasma generating means.

As another example, the apparatus comprises at least a film forming chamber which can be sealed, a substrate table which is accommodated in the film forming chamber and mounts a substrate to be processed, heating means, mounted on the substrate table, for heating the substrate, source gas supply means for injecting a source gas containing an organic compound into the film forming chamber, nitriding gas supply means for injecting a nitriding gas containing nitrogen into the film forming chamber, plasma generating means including a monopole antenna which generates a plasma of the nitriding gas introduced by the nitriding gas supply means, and exhaust means for evacuating the inside of the film forming chamber, wherein the source gas is introduced by the source gas supply means, thereby forming an adsorption layer containing the organic compound on the substrate to be processed, which is heated by the heating means, and then the adsorption layer is nitrided by atomic nitrogen produced by the plasma of the nitriding gas, which is generated by the plasma generating means.

The above-described apparatus for growing a plasma atomic layer may further comprise lifting means for changing the distance between the monopole antenna and the substrate table.

EFFECTS OF THE INVENTION

As has been described above, according to the present invention, atomic oxygen and nitrogen produced by a plasma generated by the monopole antenna are used in oxidizing and nitriding the adsorption layer in the atomic layer growth. This produces an excellent effect of improving the rate of film formation by atomic layer growth using a plasma, while the occurrence of any damage is suppressed.

BEST MODE FOR CARRYING OUT THE INVENTION

An embodiment of the present invention will be described below with reference to the accompanying drawings. FIGS. 1A to 1G are sectional views for explaining the processes of a method for growing a plasma atomic layer according to the embodiment of the present invention. First, a substrate 101 made of, e.g., silicon is mounted into a film forming chamber of an apparatus for growing an atomic layer, which has a plasma generating unit using a plurality of bar-like monopole antennas, the pressure in the film forming chamber is set to about 2 to 3 Pa by a predetermined exhaust mechanism, and the substrate 101 is heated to about 400° C. An example of the substrate 101 is a circular substrate which has a diameter of 6 inches and is made of single-crystal silicon having its (100) plane as a major surface. The substrate 101 is kept heated until a series of thin-film formation are completed.

Figure 1A:
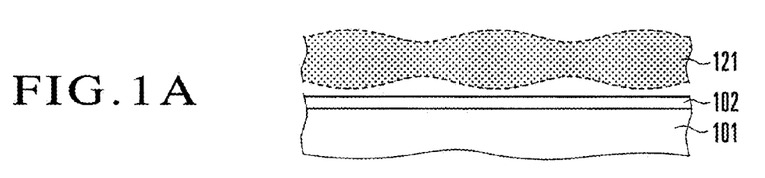
FIGS. 1A to 1G are sectional views for explaining the processes of a method for growing a plasma atomic layer according to an embodiment of the present invention.

In this state, a source gas 121 containing aminosilane as an organic compound is introduced into the film forming chamber, thereby supplying the source gas 121 onto the substrate 101 heated, as shown in FIG. 1A. The supply of the source gas 121 is performed for, e.g., about 2 sec. With this operation, an adsorption layer 102 in which aminosilane molecules (organic compound molecules) as the material are adsorbed onto the substrate 101 is formed on the substrate 101 (first step).

Figure 1B:
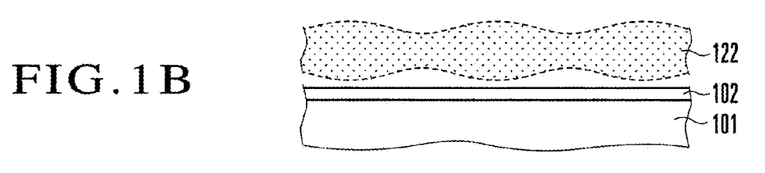

The injection of the source gas 121 into the film forming chamber is then stopped. An inert gas (purge gas) 122 such as nitrogen or argon is introduced, and the inside of the film forming chamber is evacuated by an exhaust means (vacuum pump), thereby removing (purging) any surplus gas other than the gas adsorbed (chemisorbed) onto the substrate 101 (adsorption layer 102) from inside the film forming chamber, as shown in FIG. 1B (second step).

Figure 1C:
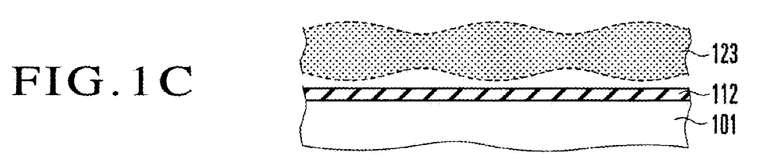

Oxygen gas (oxidizing gas), for example, is then introduced into the film forming chamber as a reactant gas containing a reactant substance, and high-frequency power is supplied to the plurality of monopole antennas arranged above the substrate 101 in the film forming chamber to generate a plasma of the introduced oxygen gas. Atomic oxygen (atomic substance) 123 is thereby supplied onto the surface of the adsorption layer 102 as an aminosilane molecular layer, as shown in FIG. 1C. This plasma generation is performed for about 1 sec. With this operation, the atomic oxygen reacts (combines) with the molecules (adsorption layer 102) adsorbed onto the surface of the substrate 101 to oxidize the adsorption layer 102, thereby forming a silicon oxide layer (compound layer) 112 as an oxide layer corresponding to one atomic layer of silicon on the surface of the substrate 101, as shown in FIG. 1C (third step). Note that oxygen gas may be introduced while the pressure in the film forming chamber is stabilized to some extent by injecting an inert gas such as argon, thereby generating a plasma in this state.

Figure 1D:
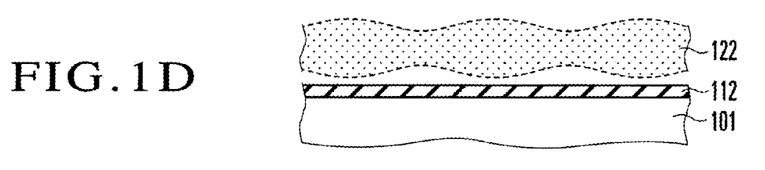

The injection of the oxygen gas into the film forming chamber is then stopped. A purge gas 122 is introduced, and the inside of the film forming chamber is evacuated by a vacuum pump, thereby removing (purging) the oxygen gas from inside the film forming chamber, as shown in FIG. 1D. This purge process is performed for, e.g., 5 sec.

Figure 1E:
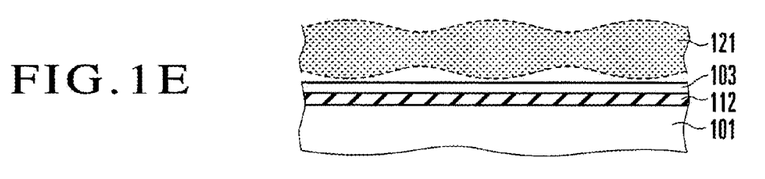

A source gas 121 is then supplied onto the substrate 101, thereby forming a new adsorption layer 103 on the silicon oxide layer (compound layer) 112, as shown in FIG. 1E. This process is the same as in the adsorption process (first step) described with reference to FIG. 1A.

Figure 1F:
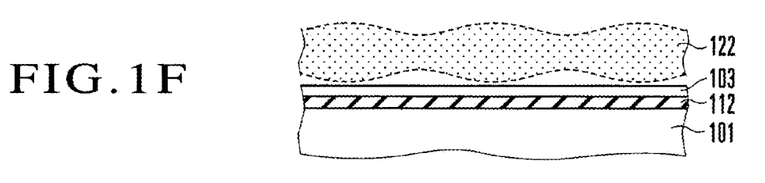

The injection of the source gas 121 into the film forming chamber is then stopped. A purge gas 122 is introduced, and the inside of the film forming chamber is evacuated by a vacuum pump, thereby removing (purging) the surplus gas (source gas 121) from inside the film forming chamber, as shown in FIG. 1F (second step).

Figure 1G:
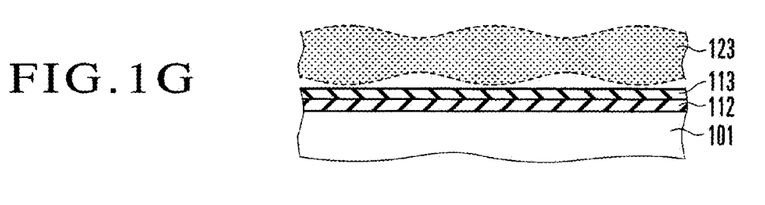

Oxygen gas, for example, is then introduced into the film forming chamber, and high-frequency power is supplied to the plurality of monopole antennas in the film forming chamber to generate a plasma of the introduced oxygen gas. Atomic oxygen 123 is thereby supplied onto the surface of the adsorption layer 103 as an aminosilane molecular layer, as shown in FIG. 1G. This plasma generation is performed for about 1 sec. With this operation, the adsorption layer 103 adsorbed onto the surface of the silicon oxide layer 112 formed already is oxidized, thereby forming a silicon oxide layer 113 corresponding to one atomic layer of silicon on the surface of the silicon oxide layer 112, as shown in FIG. 1G. This process is the same as the oxidation process (third step) described with reference to FIG. 1C.

As has been described above, a silicon oxide layer is formed on the substrate 101 by a series of basic processes in FIGS. 1A to 1D, i.e., adsorption→purge→plasma oxidation using the monopole antennas→purge. FIG. 1 shows a case in which the basic processes are repeated twice. By repeating these basic processes 200 times, a silicon oxide film having a thickness of about 20 nm is formed on the silicon substrate. The above-described method for growing a plasma atomic layer illustrated in FIG. 1 can perform the oxidation process in a very short period of time, thus improving the film forming rate.

Figure 2A:
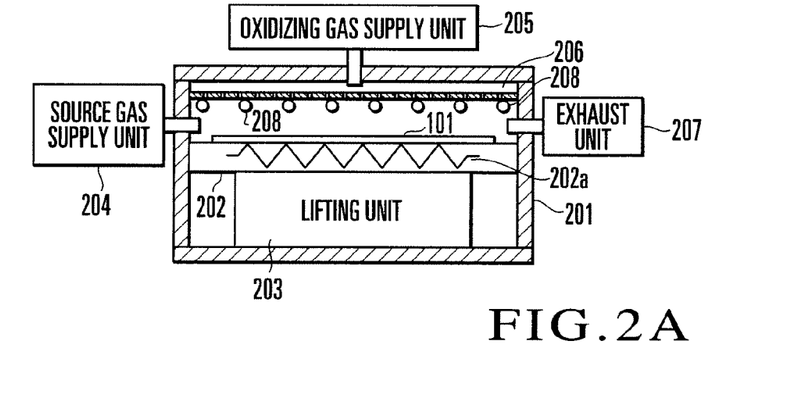
FIG. 2A is a view showing an arrangement example of an apparatus for growing a plasma atomic layer according to the embodiment of the present invention.
Figure 2B:
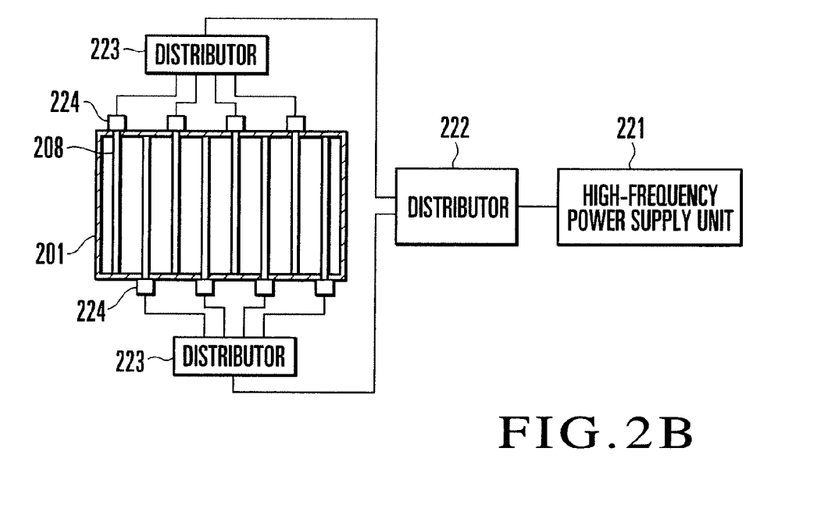
FIG. 2B is a view showing the arrangement example of the apparatus for growing a plasma atomic layer according to the embodiment of the present invention.

An apparatus for growing a plasma atomic layer, which can practice the above-described method for growing a plasma atomic layer will be explained next. FIGS. 2A and 2B are views showing an arrangement example of an apparatus for growing a plasma atomic layer according to the embodiment of the present invention. The apparatus for growing a plasma atomic layer comprises a film forming chamber 201 which can be sealed, a substrate table 202 which is accommodated in the film forming chamber 201 and incorporates a heating mechanism (heating means) 202a, and a lifting unit 203 which moves up and down the substrate table 202 in the film forming chamber 201, as shown in FIG. 2A. The film forming chamber 201 can be supplied with a source gas such as aminosilane by a source gas supply unit 204, and also can be supplied with an oxidizing gas such as oxygen by an oxidizing gas supply unit (reactant gas supply means) 205. The film forming chamber 201 communicates with an exhaust unit 207 such as a vacuum pump to be able to evacuate the inside of the film forming chamber 201.

Oxygen gas supplied by the oxidizing gas supply unit 205 is introduced into the film forming chamber 201 via a showerhead nozzle 206 arranged above the film forming chamber 201. The apparatus for growing a plasma atomic layer additionally comprises a plurality of bar-like monopole antennas 208 arrayed at an interval of, e.g., 50 mm in the space between the showerhead nozzle 206 and the substrate table 202, as shown in FIG. 2A. Also, in the apparatus for growing a plasma atomic layer, a high-frequency wave in the VHF band (e.g., 80 MHz) generated by a high-frequency power supply unit 221 is distributed by distributors 222 and 223, and supplied to the monopole antennas 208 via matching units 224, as shown in FIG. 2B. FIG. 2B is a plan view of this state. These units constitute a plasma generating means.

For example, the inside of the film forming chamber 201 is evacuated up to, e.g., about 1 Pa, and then oxygen gas (reactant gas) is introduced via the showerhead nozzle 206 by the oxidizing gas supply unit 205 to the degree that the pressure in the film forming chamber 201 becomes about 20 Pa. In this state, when the high-frequency power supply unit 221 supplies a high-frequency power of 1,500 W to the monopole antennas 208, an oxygen plasma is generated around the monopole antennas 208, thereby generating atomic oxygen (atomic substance). The above-described oxygen plasma is used in the oxidation process described with reference to FIGS. 1C and 1G. In such generation of a plasma using monopole antennas, when the antenna length is equal to ¼, ¾, or 5/4 the wavelength of a supplied high-frequency wave, a standing wave is generated and resonates so as to generate a plasma. The electron temperature of the plasma generated at this time decreases as the substrate separates from the monopole antennas 208 in a direction perpendicular to the monopole antennas 208. For example, when the substrate separates from the monopole antennas 208 by about 30 mm, it is possible to suppress the occurrence of any damage to the film structure inflicted by the plasma.

A silicon oxide film formed by the atomic layer growth using an oxygen plasma in the oxidation process described above is imparted with a high dielectric breakdown voltage. For example, the dielectric breakdown field of a silicon oxide film formed by atomic layer growth using $H_2O$ as the oxidizing gas is 6 MV/cm, and that of a silicon oxide film formed by atomic layer growth using $O_3$ as the oxidizing gas is 5 MV/cm. Compared to these values, the dielectric breakdown field of a silicon oxide film formed by the atomic layer growth using an oxygen plasma in the oxidation process is as extremely high as 8 MV/cm.

In the process of forming an adsorption layer by supplying a source gas into the film forming chamber, the inside of the film forming chamber 201 is preferably as narrow as possible in order to efficiently adsorb the supplied material. On the other hand, in the process of injecting oxygen gas to generate a plasma, thereby oxidizing the adsorption layer, the substrate 101 is preferably separated from the monopole antennas 208 to some extent. For this reason, in the process of forming an adsorption layer, the lifting unit 203 moves up the substrate table 202 toward the upper portion in which the showerhead nozzle 206 is arranged so that the region into which the source gas is introduced is narrowed, as shown in FIG. 2A. For example, the distance between the monopole antennas 208 and the substrate 101 is set to about 5 mm.

Figure 3:
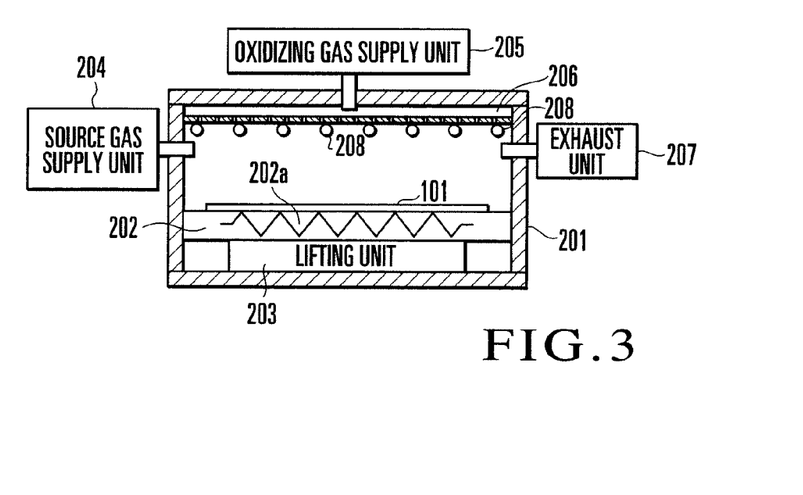
FIG. 3 is a view showing another state of the apparatus for growing a plasma atomic layer shown in FIG. 2A.

In the process of oxidizing the adsorption layer, the lifting unit 203 moves down the substrate table 202 so that the monopole antennas 208 and the substrate 101 mounted on the substrate table 202 further separate from each other, as shown in FIG. 3. For example, the distance between the monopole antennas 208 and the substrate 101 is set to about 50 mm. With this operation, any damage to the film structure inflicted by the plasma is further suppressed.

Although a case in which an oxide film is formed has been exemplified above, the present invention is not particularly limited to this, and the same applies even to a case in which a nitride film is formed. For example, in the process described with reference to FIGS. 1C and 1G, when nitrogen gas is introduced in place of oxygen gas, and high-frequency power is supplied to the monopole antennas, thereby generating a plasma, the adsorption layer can be nitrided. Even in this case, it is only necessary to use the apparatus for growing a plasma atomic layer shown in FIGS. 2A, 2B, and 3 and to provide a nitriding gas supply unit in place of an oxidizing gas supply unit to supply a nitriding gas (reactant gas) such as nitrogen.

Although the formation of a silicon oxide film using aminosilane as the material (organic compound) has been exemplified above, the present invention is not particularly limited to this. For example, the same applies to a case in which a silicon oxide film and silicon nitride film are formed using a material such as alkylsilane or alkoxysilane as an organic compound. The same also applies to the formation of an oxide film and nitride film using an organic compound containing, e.g., a metal or a semiconductor such as germanium as the material. For example, it is possible to form a metal oxide film and metal nitride film using organometallic compounds containing, e.g., Al, Zr, Hf, and In.

Figure 4A:
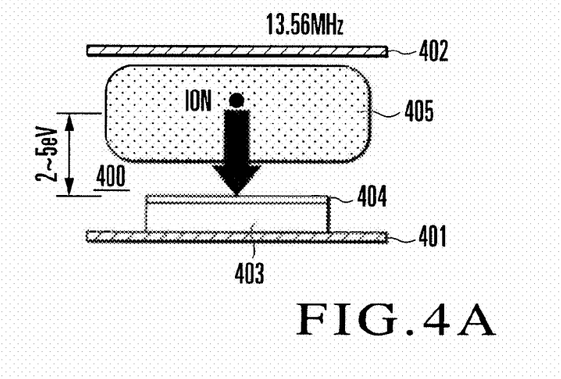
FIG. 4A is a view for explaining the features of a parallel-plate type plasma apparatus.

The features of a plasma apparatus using monopole antennas will be explained next. For comparison, a parallel-plate type plasma apparatus will be explained first. The parallel-plate type means a CCP (Capacitively Coupled Plasma) type plasma generation scheme using two parallelly opposing electrodes. In the parallel-plate type plasma apparatus, a substrate 403 to be processed is inserted between two electrodes 401 and 402 opposing in a film forming chamber 400, as shown in FIG. 4A. Ions generated in a plasma 405 generated between the two electrodes 401 and 402 collide against a thin film 404 deposited on the substrate 403.

Figure 4B:
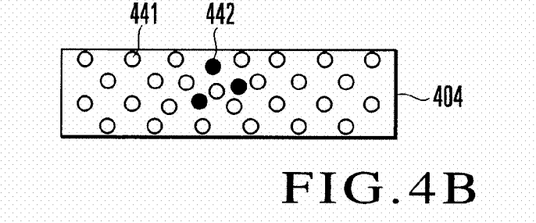
FIG. 4B is a view for explaining the features of a thin film formed using the parallel-plate type plasma apparatus.

In the parallel-plate type plasma apparatus, the potential of the plasma 405 generated is as high as 2 to 5 eV, so the ions generated in the plasma 405 have high energies. For this reason, ions having high energies collide against the thin film 404. This inflicts damage to the thin film 404 so that defects occur in the thin film 404 and its interface with the substrate, resulting in a decrease in film quality. Also, a large amount of impurities such as molecules and hydrogen contained in the source gas and the atoms of a metal which forms the film forming chamber mixes into the thin film 404, in addition to substances 441 which form the thin film 404, as shown in FIG. 4B.

Figure 5A:
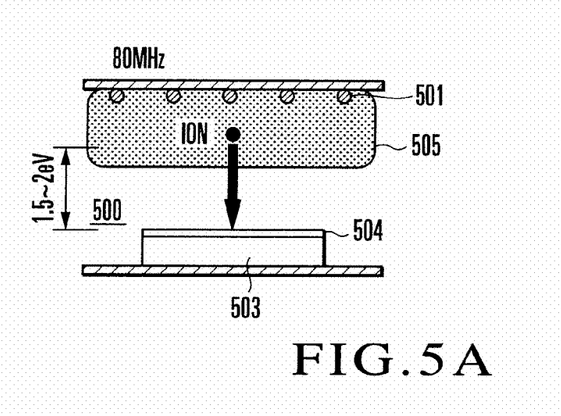
FIG. 5A is a view for explaining the features of a plasma apparatus using monopole antennas.
Figure 5B:
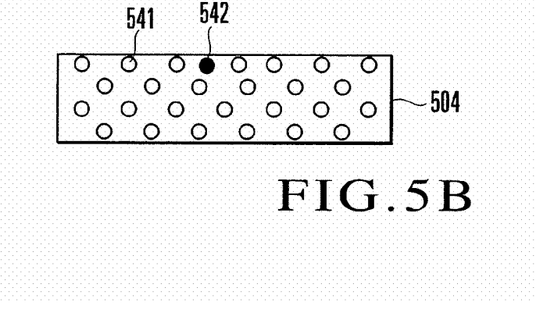
FIG. 5B is a view for explaining the features of a thin film formed by the plasma apparatus using monopole antennas.

Even in the plasma apparatus using monopole antennas, ions generated in a plasma 505 generated by monopole antennas 501 collide against a thin film 504 deposited on a substrate 503 accommodated in a film forming chamber 500, as shown in FIG. 5A. Nevertheless, when the monopole antennas are used, the potential of the plasma 505 generated is as relatively low as 1.5 to 2 eV, so the ions generated in the plasma 505 have low energies. Consequently, since ions having low energies reach the thin film 504, damage to the thin film 504 is less likely to occur, thus suppressing the occurrence of defects of the thin film 504. Still better, impurities 542 other than substances 541 which form the thin film 504 are reduced, as shown in FIG. 5B.

Figure 6:
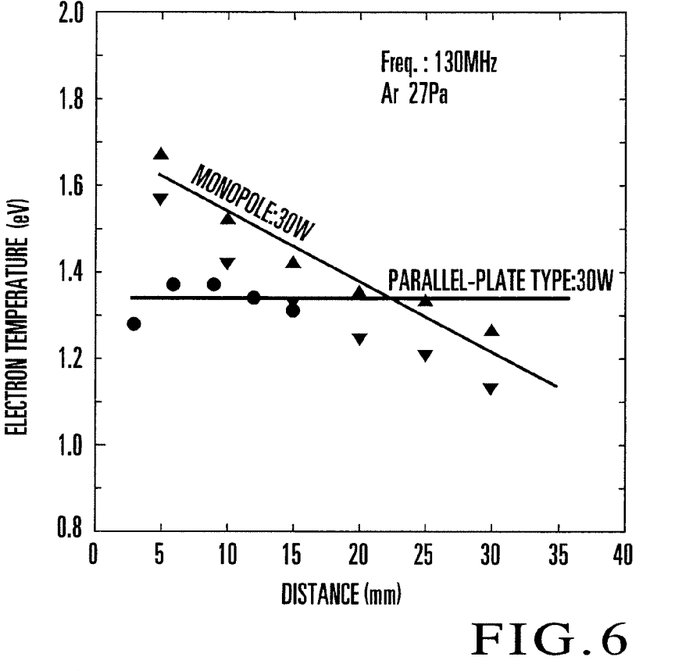
FIG. 6 is a graph for explaining the relationship between the distance from a monopole antenna which generates a plasma and the electron temperature of the plasma.

The relationship between the distance from a monopole antenna which generates a plasma and the electron temperature of the plasma will be explained. When a plasma is generated using monopole antennas, the electron temperature of the plasma decreases as the distance from the antenna increases, as shown in FIG. 6. In contrast, when the parallel-plate type plasma apparatus is used, the electron temperature of the plasma does not decrease even when the distance from the electrode increases. Referring to FIG. 6, the black up-pointing triangles indicate a case in which a plasma is generated by an output of 30 W using monopole antennas, the black down-pointing triangles indicate a case in which a plasma is generated by an output of 15 W using monopole antennas, and the black circles indicate a case in which a plasma is generated by an output of 30 W using the parallel-plate type plasma apparatus. As the plasma generation conditions, a high-frequency wave having a frequency of 130 MHz is supplied to the monopole antennas, and argon is used as the plasma gas, and the gas pressure is 27 Pa.

Figure 7:
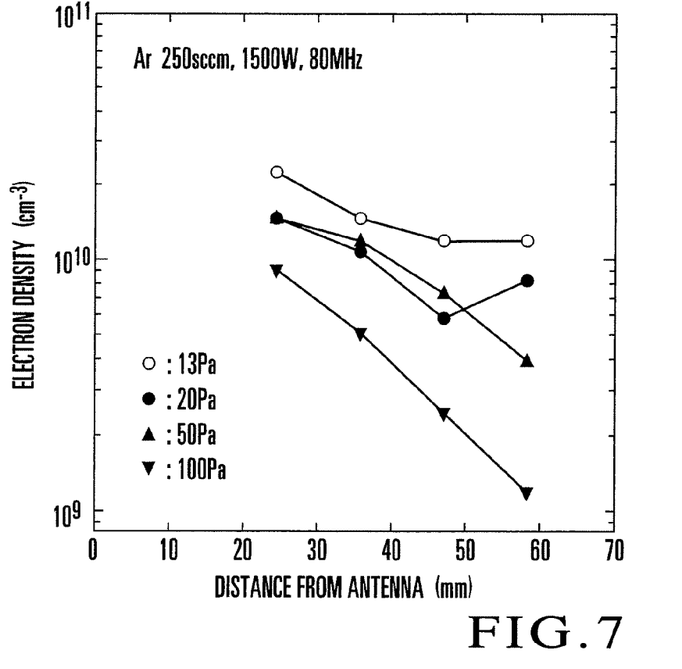
FIG. 7 is a graph for explaining the relationship between the distance from a monopole antenna which generates a plasma and the electron density of the plasma.

The relationship between the distance from a monopole antenna which generates a plasma and the electron density of the plasma will be explained. In most cases, the electron density decreases as the distance from the monopole antenna increases, as shown in FIG. 7. The electron density also decreases as the pressure of the supplied plasma gas increases. Referring to FIG. 7, as the plasma generation conditions, a high-frequency wave having a frequency of 80 MHz is supplied to the monopole antennas, argon is used as the plasma gas, and the gas supply flow rate is 250 sccm. Under these conditions, the exhaust condition is changed among a gas pressure of 13 Pa (white circles), that of 20 Pa (black circles), that of 50 Pa (black up-pointing triangles), and that of 100 Pa (black down-pointing triangles).

Figure 8:
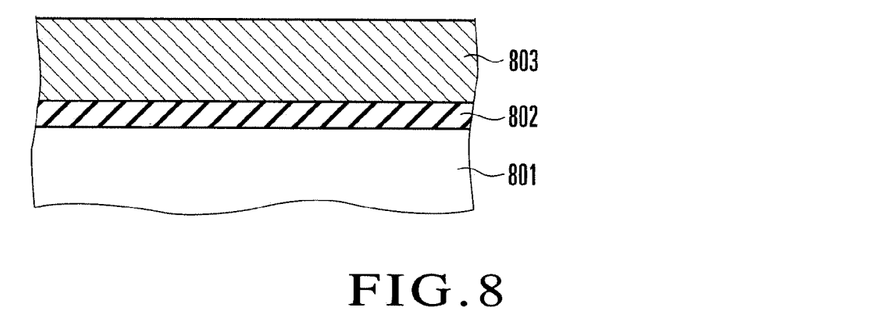
FIG. 8 is a sectional view showing the partial structure of a MOS capacitor fabricated as a sample.

The features of a silicon oxide film formed by the above-described manufacturing method according to this embodiment using monopole antennas will be explained. In the investigation of this features, first, a silicon oxide layer 802 was formed on a silicon substrate 801 made of p-type single-crystal silicon, and an aluminum electrode layer 803 was formed on the silicon oxide layer 802, thereby forming a MOS capacitor, as shown in the sectional view of FIG. 8, and the interface state density and flat band shift of this MOS capacitor were measured. In the formation of the silicon oxide layer 802, aminosilane was used as the source gas, and oxygen gas was used as the oxidizing gas. The pressure in the film forming chamber during the film formation was 100 Pa, and the substrate heating temperature during the film formation was 400° C. In the plasma generation of the oxidation process, the RF power supplied to the monopole antennas was 1,500 W. The above-described series of basic processes, i.e., adsorption→purge→plasma oxidation using the monopole antennas→purge were repeated 200 times, thereby forming a silicon oxide layer 802 having a thickness of 24 nm. The formed silicon oxide layer 802 was annealed at 400° C. after the deposition.

Figure 9:
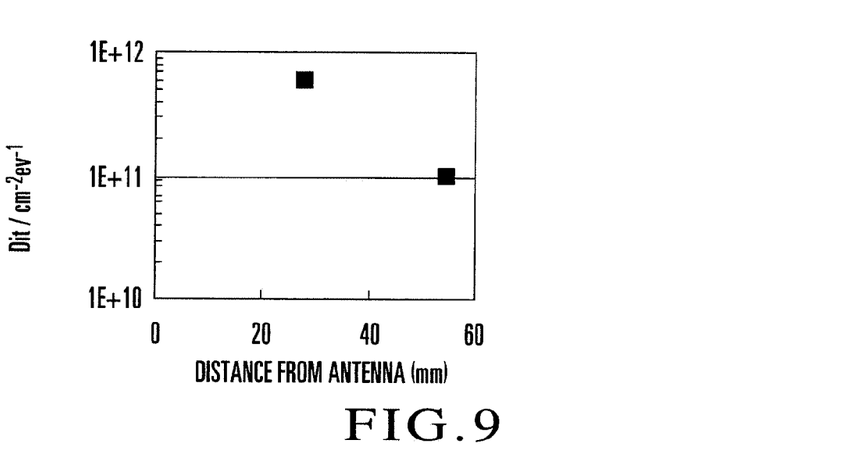
FIG. 9 is a graph showing the result of measuring the interface state density of the fabricated sample.
Figure 10:
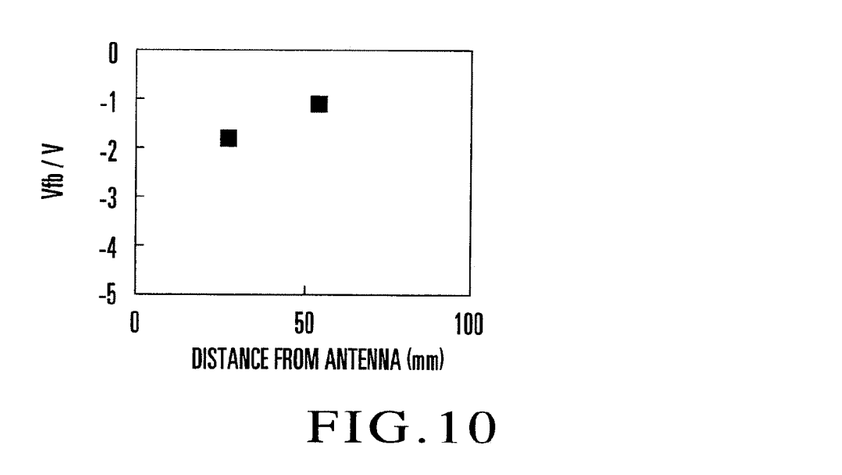
FIG. 10 is a graph showing the result of measuring the flat band shift of the fabricated sample.

The interface state density (Dit/cm$^{-2}$ev$^{-1}$) of the MOS capacitor having the above-described structure decreases as a sample (MOS capacitor) is fabricated by increasing the distance from the antenna, as shown in FIG. 9. The flat band shift ($V_{fb}$/V) of the MOS capacitor having the above-described structure becomes close to zero as a sample is fabricated by increasing the distance from the antenna, as shown in FIG. 10. As can be understood from these facts, the quality of a formed thin film improves as a substrate to be processed (formed thin film) separates from the monopole antennas in the oxidation process.

Industrial Applicability

The present invention is preferably adopted in the formation of the gate insulating layer of a transistor.

The invention claimed is:

1. A method for growing a plasma atomic layer, comprising at least:
   a first step of supplying a source gas containing an organic compound onto a surface of a heated substrate, thereby forming an adsorption layer in which the organic compound is adsorbed onto the surface of the substrate in a film forming chamber which accommodates a monopole antenna;
   a second step of removing the source gas from inside the film forming chamber after the supply of the source gas is stopped; and
   a third step of injecting a reactant gas containing a reactant substance into the film forming chamber, and supplying a high-frequency wave to the monopole antenna to generate a plasma of the reactant gas, thereby producing an atomic substance, and combining the atomic substance with the adsorption layer, thereby forming a compound layer, in which the adsorption layer is combined with the reactant substance, on the substrate,
   wherein the reactant substance oxidizes or nitrides the adsorption layer and a distance between the monopole antenna and the substrate in the third step is longer than the distance between the monopole antenna and the substrate in the first step.

2. A method for growing a plasma atomic layer according to claim 1, characterized in that the reactant substance is one member selected from the group consisting of oxygen and nitrogen.

3. A method for growing a plasma atomic layer, comprising at least:
   a first step of supplying a source gas containing an organic compound onto a surface of a heated substrate, thereby forming an adsorption layer in which the organic compound is adsorbed onto the surface of the substrate in a film forming chamber which accommodates a monopole antenna;
   a second step of removing the source gas from inside the film forming chamber after the supply of the source gas is stopped; and
   a third step of injecting an oxidizing gas containing oxygen into the film forming chamber, and supplying a high-frequency wave to the monopole antenna to generate a plasma of the oxidizing gas, thereby producing atomic oxygen, and oxidizing the adsorption layer by the atomic oxygen, thereby forming an oxide layer on the substrate,
   wherein a distance between the monopole antenna and the substrate in the third step is longer than the distance in the first step.

4. A method for growing a plasma atomic layer, comprising at least:
   a first step of supplying a source gas containing an organic compound onto a surface of a heated substrate, thereby forming an adsorption layer in which the organic compound is adsorbed onto the surface of the substrate in a film forming chamber;
   a second step of removing the source gas from inside the film forming chamber after the supply of the source gas is stopped; and
   a third step of injecting a nitriding gas containing nitrogen into the film forming chamber, and supplying a high-frequency wave to the monopole antenna to generate a plasma of the nitriding gas, thereby producing atomic nitrogen, and nitriding the adsorption layer by the atomic nitrogen, thereby forming a nitride layer on the substrate,
   wherein a distance between the monopole antenna and the substrate in the third step is longer than the distance in the first step.

* * * * *